United States Patent
Yang

(10) Patent No.: US 10,158,332 B2
(45) Date of Patent: Dec. 18, 2018

(54) OUTPUT STAGE CIRCUIT

(71) Applicant: ALi Corporation, Hsinchu (TW)

(72) Inventor: Song-Ji Yang, Hsinchu (TW)

(73) Assignee: ALI CORPORATION, Hsinchu (TW)

( * ) Notice: Subject to any disclaimer, the term of this patent is extended or adjusted under 35 U.S.C. 154(b) by 0 days.

(21) Appl. No.: 15/691,816

(22) Filed: Aug. 31, 2017

(65) Prior Publication Data

US 2018/0145638 A1     May 24, 2018

(30) Foreign Application Priority Data

Nov. 18, 2016 (CN) .......................... 2016 1 1028140

(51) Int. Cl.
| | |
|---|---|
| *H03F 1/14* | (2006.01) |
| *H03F 1/26* | (2006.01) |
| *H03F 1/30* | (2006.01) |
| *H03F 3/185* | (2006.01) |
| *H03F 3/217* | (2006.01) |

(52) U.S. Cl.
CPC ............... *H03F 1/26* (2013.01); *H03F 1/305* (2013.01); *H03F 3/185* (2013.01); *H03F 3/217* (2013.01); *H03F 2200/03* (2013.01); *H03F 2200/411* (2013.01); *H03F 2200/465* (2013.01)

(58) Field of Classification Search
CPC . H03F 3/72; H03F 2200/414; H03F 2200/417
USPC ................................... 330/51; 381/94.5, 120
See application file for complete search history.

(56) References Cited

U.S. PATENT DOCUMENTS

| | | | |
|---|---|---|---|
| 8,036,399 B2 | 10/2011 | Chao et al. | |
| 8,526,635 B2 * | 9/2013 | Larsen ................ | H01L 27/0281 381/94.1 |
| 2010/0214023 A1 * | 8/2010 | Hou ........................ | H03F 1/305 330/307 |

FOREIGN PATENT DOCUMENTS

CN        102547530 A    7/2012

* cited by examiner

*Primary Examiner* — Steven J Mottola
(74) *Attorney, Agent, or Firm* — McClure, Qualey & Rodack, LLP

(57) ABSTRACT

An output stage circuit including an amplifier, a switching circuit and a selection circuit is provided. The amplifier converts an input signal into an output signal. The switching circuit is coupled between an output terminal of the amplifier and ground. The selection circuit includes a first-mode-selection-unit and a second-mode-selection unit. The first control signal is selected as a switching signal by the first-mode-selection unit when a power-detection signal is in a high level, so that the switching circuit is selectively turned on. The switching circuit is turned on according to a voltage stored in a storage capacitor of the second-mode-selection unit when the power-detection signal is in a low level, so that the output terminal of the amplifier is coupled to the ground.

10 Claims, 6 Drawing Sheets

OUTPUT STAGE CIRCUIT

This application claims the benefit of People's Republic of China Patent Application No. 201611028140.5, filed Nov. 18, 2016, the subject matter of which is incorporated herein by reference.

FIELD OF THE INVENTION

The present invention relates to an output stage circuit, and more particularly to an output stage circuit for outputting audio signals.

BACKGROUND OF THE INVENTION

In case that an electronic product has the multimedia playing function, the electronic product is usually equipped with an audio chip. The audio chip outputs audio signals to a speaker through an output stage circuit. Once the supplied power is suddenly interrupted during the process of switching off the electronic product, the residual charges of the output stage circuit are possibly transmitted to the speaker. Under this circumstance, the pop noise is generated. The pop sound is unpleasant to the hearing of the user.

Therefore, it is important to provide an approach for avoiding the pop noise when the supplied power is suddenly interrupted.

SUMMARY OF THE INVENTION

The present invention provides an output stage circuit for effectively avoiding the generation of the pop noise in response to the sudden power interruption event.

An embodiment of the present invention provides an output stage circuit. The output stage circuit includes an amplifier, a switching circuit and a selection circuit. The amplifier converts an input signal into an output signal, wherein the amplifier has an output terminal. The switching circuit is coupled between the output terminal of the amplifier and ground. The selection circuit includes a first-mode-selection unit and a second-mode-selection unit. The first-mode-selection unit receives a first control signal. The first control signal is selected as a switching signal by the first-mode selection-unit when a power-detection signal is in a first level, so that the switching signal selectively turns on the switching circuit. The second-mode-selection unit has a storage capacitor. The switching circuit is turned on according to a voltage stored in the storage capacitor when the power-detection signal is in a second level, so that the output terminal of the amplifier is coupled to the ground. The first level is higher than the second level.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
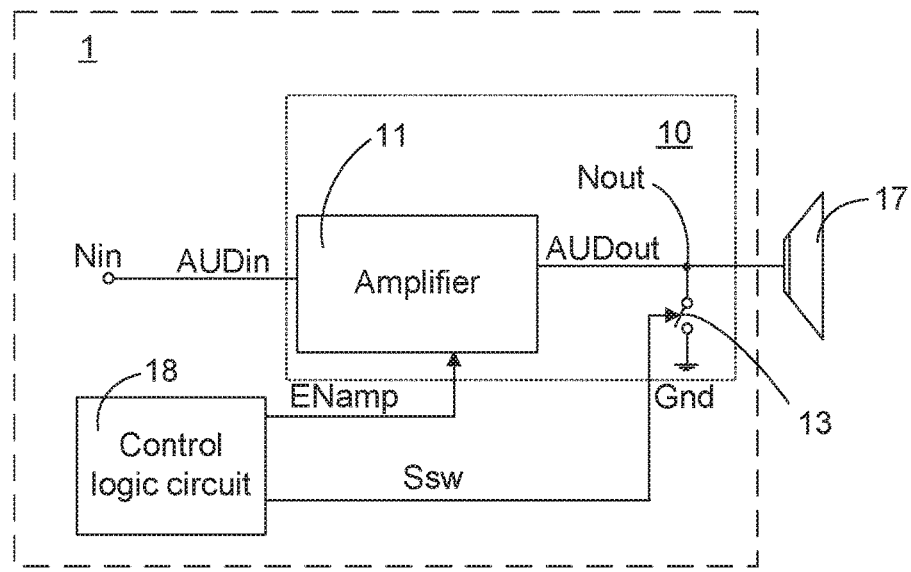
FIG. 1 is a schematic block diagram illustrating the architecture of an output stage circuit of an audio chip.

FIG. 1 is a schematic block diagram illustrating the architecture of an output stage circuit of an audio chip. The architecture of FIG. 1 can be used to explain the reason why the pop noise is generated. The audio chip 1 is coupled to a speaker 17. The output stage circuit 10 includes an amplifier 11 and a switching circuit 13. The amplifier 11 is used for converting an input signal AUDin into an output signal AUDout. An output terminal of the amplifier 11 is coupled to an output node Nout of the output stage circuit 10.

The amplifier 11 is controlled by an amplifier-enabling signal ENamp and the amplifier 11 is selectively operates in an enabled state or a disabled state. The input signal AUDin from an input node Nin is converted (for example, amplified) into the output signal AUDout by the amplifier 11 when the amplifier 11 operates in the enabled state. The output signal AUDout is outputted to the output node Nout. The amplifier 11 has the function of filtering the low-frequency component of the input signal AUDin.

The switching circuit 13 is coupled to the amplifier 11 and controlled by a switching signal Ssw generated by a control logic circuit 18. The switching circuit 13 is turned on when the switching signal Ssw is in a high level. The switching circuit 13 is turned off when the switching signal Ssw is in a low level.

A ground voltage Gnd is transmitted to the output node Nout through the switching circuit 13 when the switching circuit 13 is turned on. The voltage at the output node Nout is equal to the ground voltage Gnd. Since the voltage of the output signal AUDout is equal to the ground voltage Gnd, no audio signal is outputted from the speaker 17.

The voltage at the output node Nout is equal to the output signal AUDout when the switching circuit 13 is turned off. Meanwhile, the speaker 17 issues the audio signal according to the output signal AUDout.

An audio decoder (not shown) of the audio chip 1 issues a specified mute pattern to the input node Nin of the output stage circuit 10 in order to inform the output stage circuit 10 to adjust the voltage of the output node Nout to 0V when the audio chip 1 receives a shutdown command or detects a sudden power interruption event.

In response to the generation of the mute pattern, the switching signal Ssw is changed from the low level to the high level. Correspondingly, the ground voltage Gnd is transmitted to the output node Nout through the switching circuit 13. Meanwhile, the voltage at the output node Nout is equal to the ground voltage Gnd. Since the voltage of the output signal AUDout is equal to the ground voltage Gnd, the speaker 17 stops generating the audio signal.

Figure 2:
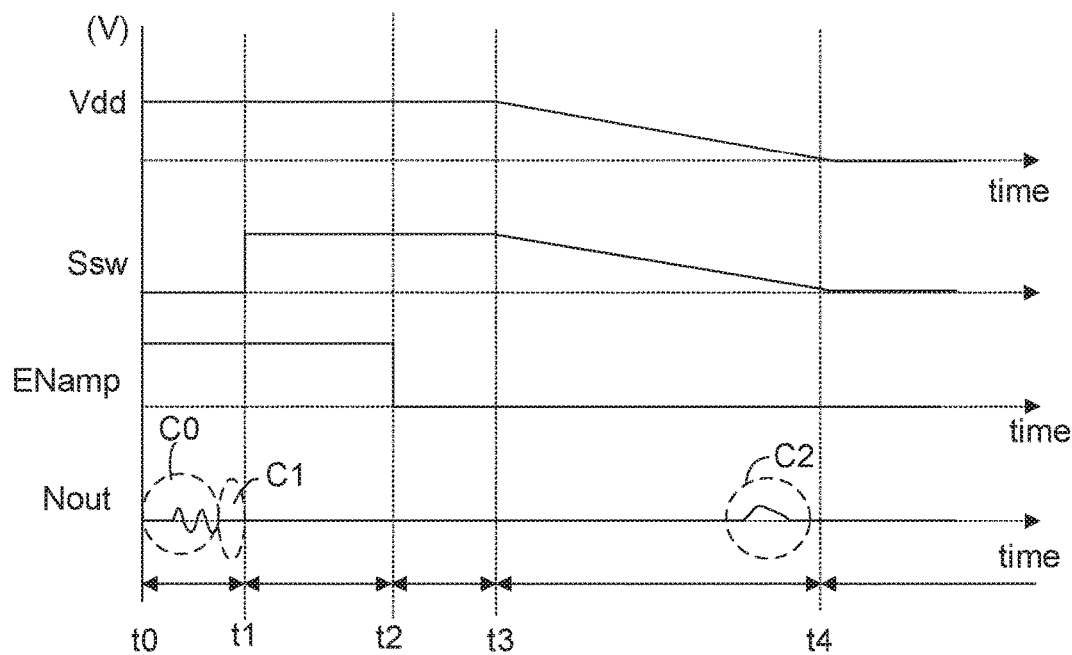
FIG. 2 is a schematic timing waveform diagram illustrating associated signals of the output stage circuit of the audio chip as shown in FIG. 1 when an electronic device with the audio chip is switched off.

FIG. 2 is a schematic timing waveform diagram illustrating associated signals of the output stage circuit of the audio chip as shown in FIG. 1 when an electronic device with the audio chip is switched off. The waveforms of the associated signal can be used to explain the reason why the pop noise is generated. From top to bottom of FIG. 2, the voltage waveforms of the supply voltage Vdd, the switching signal Ssw, the amplifier-enabling signal ENamp and the output node Nout are sequentially shown.

In the time interval between the time to and the time t1, the supply voltage Vdd is in a high level (for example, 3.3V), the switching signal Ssw is in the low level, and the voltage of the output node Nout is the output signal AUDout generated by the audio decoder in the normal playing mode (that is, the circumscribed region C0). In this time interval, the audio decoder originally issues the input signal AUDin to the output stage circuit 10 and the output stage circuit 10 generates the output signal AUDout at the output node Nout. In other words, the speaker 17 generates sound in the time period corresponding to the circumscribed region C0. The audio decoder issues a specified mute pattern to the output stage circuit 10 when a shutdown command is received. After the mute pattern is received by the output stage circuit 10, the voltage of 0V is transmitted to the output node Nout (that is, the circumscribed region C1). The speaker 17 stops generating sound in the time period corresponding to the circumscribed region C1.

Since the mute pattern is received by the output stage circuit 10, the switching signal Ssw is changed from the low level to the high level at the time t1 under control of the control logic circuit 18. The switching circuit 13 is accordingly turned on. At the time t2, the amplifier-enabling signal ENamp is changed from the high level to the low level and the amplifier 11 is disabled. It is assumed that the sudden power interruption event occurs at the time t3, the voltage of the supply voltage Vdd is gradually decreased from the high level. The sudden power interruption event indicates that the power cable of the electronic product is pulled out or the power switch of the electronic product is turned off. The supply voltage Vdd provided to the electronic product is interrupted when the sudden power interruption event occurs.

As shown in FIG. 2, the voltage of the supply voltage Vdd is gradually decreased (that is, after the time t3), and the switching signal Ssw is correspondingly decreased with decreasing of the supply voltage Vdd. If the voltage of the switching signal Ssw drops too low, the switching circuit 13 cannot be completely turned on.

Since the switching circuit 13 is not completely turned on in the time interval between the time t3 and the time t4, the output node Nout is not coupled to the ground Gnd. In other words, the voltage of the output node Nout is not completely equal to the ground voltage Gnd. Since the voltage of the output node Nout is not completely equal to the ground voltage Gnd, the residual charges of the amplifier 11 possibly results in a small pulse at the output node Nout (for example, the circumscribed region C2). Because of the pulse at the output node Nout, the pop noise thus generated at the speaker 17. After the time t4, due to the supply voltage Vdd still maintained at the low level, the audio chip 1 is disabled completely. From now on, all of the supply voltage Vdd, the switching signal Ssw, the amplifier-enabling signal ENamp and the output node Nout are in the low level.

From the above discussions, due to the switching signal Ssw is correspondingly decreased with decreasing of the supply voltage Vdd when the audio chip 1 receives a shutdown command or detects a sudden power interruption event, once the voltage of the switching signal Ssw drops too low, the switching circuit 13 cannot be turned on completely. That said, the speaker 17 may generate the unpleasant pop noise when the electronic device is turned off or the sudden power interruption event occurs.

For avoiding the pop noise generation, the output stage circuit needs to be modified. In accordance with a feature of the present invention, the output stage circuit is additionally equipped with a selection circuit in upstream of the switching circuit. A power-detection signal PALT which changed with the supply voltage Vdd (for example, 3.3V) is received by the selection circuit. According to the level of the power-detection signal PALT, the select circuit determines the switching signal Ssw.

Figure 3:
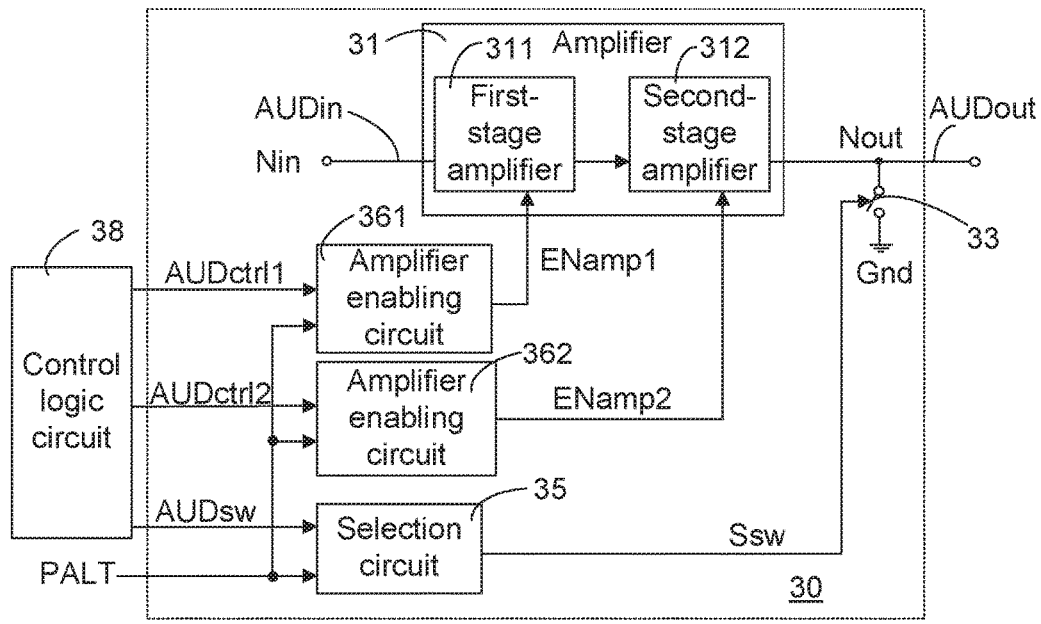
FIG. 3 is a schematic block diagram illustrating an output stage circuit according to an embodiment of the present invention.

FIG. 3 is a schematic block diagram illustrating an output stage circuit according to an embodiment of the present invention. As shown in FIG. 3, the output stage circuit 30 includes an amplifier 31, a switching circuit 33, amplifier enabling circuits 361, 362 and a selection circuit 35.

The amplifier 31 includes a first-stage amplifier 311 and a second-stage amplifier 312. The first-stage amplifier 311 is a front-stage amplifier that receives the input signal AUDin. The second-stage amplifier 312 is a rear-stage amplifier that generates the output signal AUDout. The number of amplifiers in the amplifier 31 and the connecting relationships between these amplifiers may be varied according to the practical requirements. The number of the enabling circuits is determined according to the number of amplifiers in the amplifier 31.

In one embodiment, a control logic circuit 38 of the audio chip issues a first control signal AUDsw, a second control signal AUDctrl1 and a third control signal AUDctrl2 to the selection circuit 35, the amplifier enabling circuit 361 and the amplifier enabling circuit 362, respectively.

According to the voltage level of the power-detection signal PALT, the select circuit 35 determines whether the first control signal AUDsw is used as the switching signal Ssw. Wherein, the conduction of the switching circuit 33 is controlled by the switching signal Ssw.

According to the voltage level of the power-detection signal PALT, the amplifier enabling circuit 361 and the amplifier enabling circuit 362 determine whether the second control signal AUDctrl1 and the third control signal AUDctrl2 are used as the amplifier-enabling signals ENamp1 and ENamp2, respectively. Wherein, the amplifier-enabling signals, ENamp1 and ENamp2, respectively control the enable/disable operation of the first-stage amplifier 311 and the second-stage amplifier 312.

In one embodiment, the voltage level of the power-detection signal PALT is determined according to a comparison result between a predetermined threshold voltage Vth and the supply voltage Vdd. The power-detection signal PALT is in a first level and the output stage circuit 30 operates in a first mode when the voltage level of the supply voltage Vdd is higher than or equal to the predetermined threshold voltage Vth. The power-detection signal PALT is in a second level and the output stage circuit 30 operates in a second mode when the voltage level of the supply voltage Vdd is lower than the predetermined threshold voltage Vth.

In an embodiment, the predetermined threshold voltage Vth is set as a product of the supply voltage Vdd and a value that is smaller than 1. For example, the predetermined threshold voltage Vth is set as 0.8×Vdd.

Alternatively, the power-detection signal PALT can be used together with fault-tolerance judgment or buffer judgment. For example, a first predetermined threshold voltage Vth1 and a second predetermined threshold voltage Vth2 can be set to avoid the influence of the sudden noise. Wherein, the first predetermined threshold voltage Vth1 is higher than or equal to the second predetermined threshold voltage Vth2 (that is, Vth1≥Vth2). For example, the first predetermined threshold voltage Vth1 is set as 0.8×Vdd, and the second predetermined threshold voltage Vth2 is set as 0.7×Vdd. In such way, even if the voltage of the supply voltage Vdd is influenced by small noise, the accuracy of judging the power-detection signal PALT is not impaired.

For example, if the voltage of the supply voltage Vdd is decreased from 3.3V to 2.5V, the power-detection signal PALT is still in the first level because 2.5V is lower than 0.8×Vdd (that is, 2.664V) but higher than 0.7×Vdd (that is, 2.331V). As the voltage of the supply voltage Vdd is continuously decreased and lower than the second predetermined threshold voltage Vth2, the power-detection signal PALT thus changed from the first level to the second level. In accordance with a feature of the present invention, the second predetermined threshold voltage Vth2 is the lowest voltage of the supply voltage for maintaining the basic operations of the audio chip.

Figure 4:
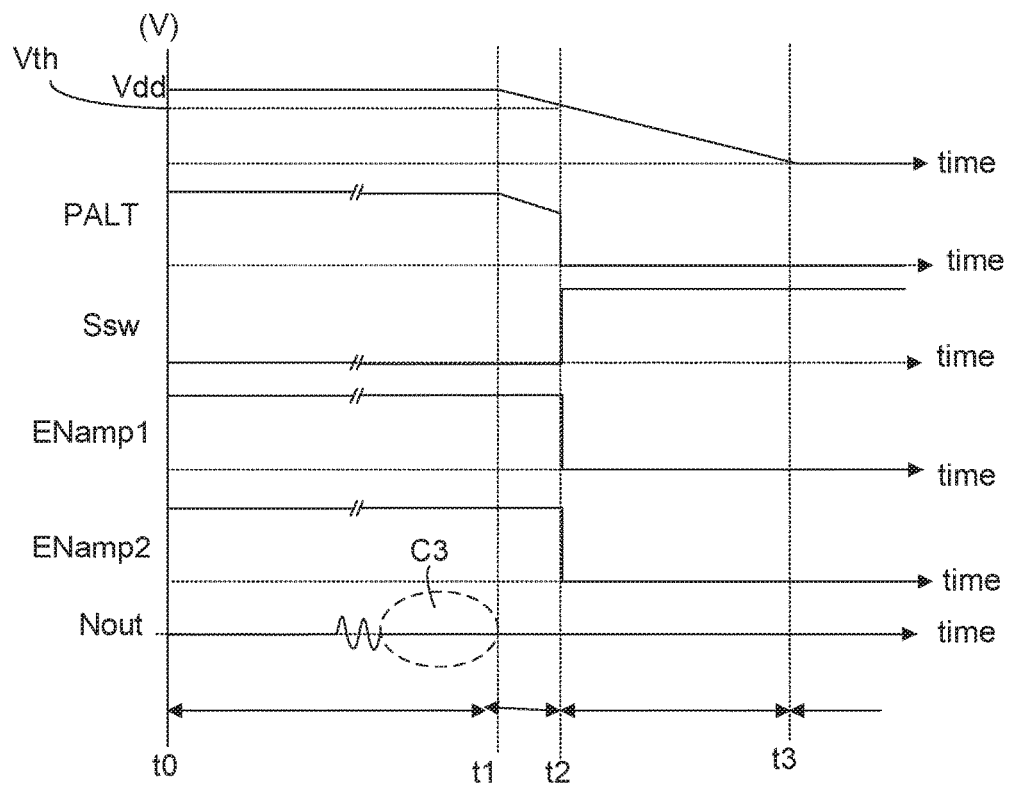
FIG. 4 is a schematic timing waveform diagram illustrating associated signals of the output stage circuit as shown in FIG. 3.

FIG. 4 is a schematic timing waveform diagram illustrating associated signals of the output stage circuit as shown in FIG. 3. From top to bottom of FIG. 4, the voltage waveforms of the supply voltage Vdd, the switching signal Ssw, the amplifier-enabling signals ENamp1 and ENamp2 and the output node Nout are sequentially shown.

As shown in FIG. 4, the supply voltage Vdd is decreased from the time t1, gradually decreased in the time interval between the time t1 and the time t3, and decreased to 0V at the time t3. Before the time t1, the power-detection signal PALT is maintained in the first level (for example, the high level). After the time t1, the level of the power-detection signal PALT is correspondingly decreased with the supply voltage Vdd. The power-detection signal PALT is changed from the first level to the second level (for example, from the high level to the low level) when the voltage of the supply voltage Vdd is lower than the predetermined threshold voltage Vth (for example, at the time t2).

Before the time t2, the switching signal Ssw is maintained in the low level because the power-detection signal PALT is in the high level. The amplifier-enabling signals ENamp1 and ENamp2 are in the high level when the power-detection signal PALT is in the high level and the first-stage amplifier 311 and the second-stage amplifier 312 are enabled. That is, the output stage circuit 30 generates the output signal AUDout to the output node Nout before the time t2.

From the time t2, the power-detection signal PALT drops to the low level. The selection circuit 35 is no longer select the first control signal AUDsw as the switching signal Ssw, but select a high level signal instead. The way of how the selection circuit 35 generates a "high level" switching signal will be described later. Since the switching signal Ssw is in the high level after the time t2, the switching circuit 33 is turned on accordingly. Since the power-detection signal PALT is in the low level after the time t2, the amplifier-enabling signals ENamp1 and ENamp2 are in the low level and thus disable the first-stage amplifier 311 and the second-stage amplifier 312 respectively.

As aforementioned, the time t2 is a separation time point. At the time t2, the power-detection signal PALT is changed to the second level. At the same time, the switching signal Ssw is changed from the low level to the high level, and the amplifier-enabling signals ENamp1 and ENamp2 are changed from the high level to the low level. The ground voltage Gnd is transmitted to the output node Nout through the switching circuit 33 when the switching circuit 33 is turned on according to the switching signal Ssw at the time t2. The voltage at the output node Nout is equal to the ground voltage Gnd. Meanwhile, the first-stage amplifier 311 and the second-stage amplifier 312 are disabled according to the amplifier-enabling signals ENamp1 and ENamp2. Accordingly, the operation of the first-stage amplifier 311 and the second-stage amplifier 312 will synchronize with the switching circuit 33.

In the time interval between the time to and the time t2, due to the switching circuit 33 is turned off, the output node Nout thus outputs 0V (the circumscribed region C3) according to the mute pattern. After the time t2, the switching circuit 33 is turned on and the ground voltage Gnd is transmitted to the output node Nout through the switching circuit 33. In other words, the voltage of the output signal AUDout is maintained in 0V after the time t2.

In accordance with the feature of the present invention, the voltages of the switching signal Ssw, the amplifier-enabling signal ENamp1 and the amplifier-enabling signal ENamp2 generated by the selection circuit 35, the amplifier enabling circuit 361 and the amplifier enabling circuit 362 are adjustable according to level of the power-detection signal PALT.

The operations of the selection circuit 35, the amplifier enabling circuit 361 and the amplifier enabling circuit 362 in response to the first level (that is, the high level) and the second level (that is, the low level) will be described in FIGS. 5 and 6.

Figure 5:
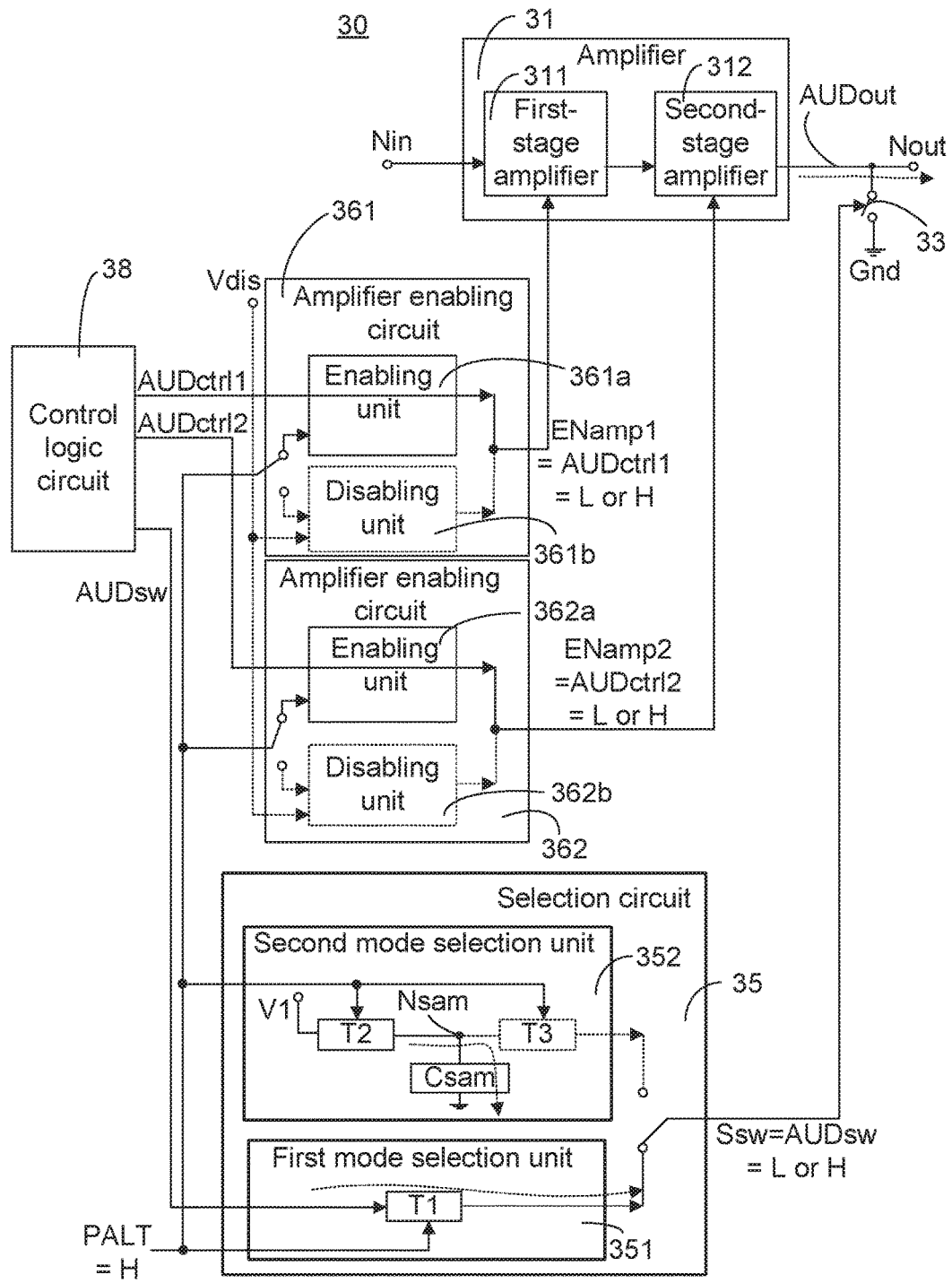
FIG. 5 is a schematic block diagram illustrating the operations of the output stage circuit when the power detection circuit is in the first level.
Figure 6:
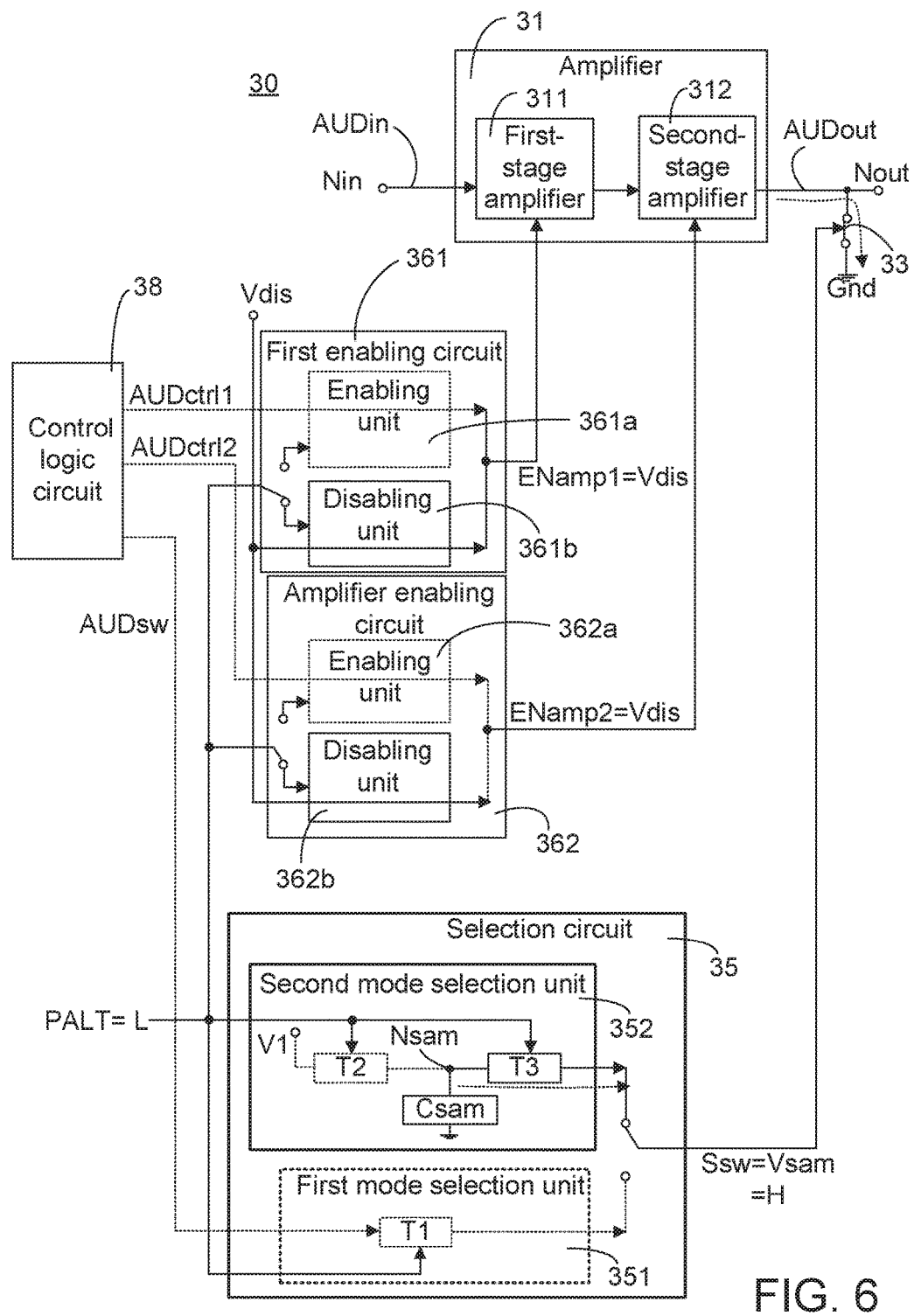
FIG. 6 is a schematic block diagram illustrating the operations of the output stage circuit when the power detection circuit is in the second level.

Please refer to FIGS. 5 and 6. The amplifier enabling circuit 361 includes an enabling unit 361a and a disabling unit 361b. The amplifier enabling circuit 362 includes an enabling unit 362a and a disabling unit 362b. The selection circuit 35 includes a first-mode-selection unit 351 and a second mode-selection-unit 352. The first-mode-selection unit 351 includes a first transistor T1. The second-mode-selection unit 352 has a storage capacitor Csam, a second transistor T2 and a third transistor T3.

In the amplifier enabling circuits 361, 362, the enabling unit 361a and the disabling unit 361b respectively utilizes the second control signal AUDctrl1 and the third control signal AUDctrl2 being transmitted from the control logic circuit 38 as the amplifier-enabling signals ENamp1, ENamp2. The amplifier-enabling signals ENamp1, ENamp2 are further respectively transmitted to the first-stage amplifier 311 and the second-stage amplifier 312 so that the first-stage amplifier 311 and the second-stage amplifier 312 operate in response. The first control signal AUDsw, the second control signal AUDctrl1 and the third control signal AUDctrl2 may be in the high level or the low level. The voltages of these control signals are determined by the control logic circuit 38.

FIG. 5 is a schematic block diagram illustrating the operations of the output stage circuit when the power-detection signal PALT is in the first level (that is, the high level). For succinctness, the components that are not selected are indicated by dotted lines.

According to an embodiment, the first transistor T1 is turned on, and the first-mode-selection unit 351 of the selection circuit 35 is selected to generate the switching signal Ssw when the power-detection signal PALT is in the first level. Since the first transistor T1 is turned on, the first control signal AUDsw is used as the switching signal Ssw by the first-mode-selection unit 351. In response to the change of the first control signal AUDsw, the switching signal Ssw is in the first level or the second level. Meanwhile, in the second-mode selection-unit 352, the second transistor T2 is turned on but the third transistor is turned off. The storage capacitor Csam is charged by a first voltage V1 (for example, the high voltage) of the supply voltage. The voltage of the sampling node Nsam is maintained in the first voltage V1. The first voltage V1 is sufficient to turn on the switching circuit 33 completely. Since the third transistor T3 is turned off, the switching signal Ssw is not influenced by the first voltage V1 of the sampling node Nsam.

The enabling unit 361a of the amplifier enabling circuit 361 and the enabling unit 362a of the amplifier enabling circuit 362 generate the amplifier-enabling signals ENamp1 and ENamp2 when the power-detection signal PALT is in the first level. Since the amplifier-enabling signals ENamp1 and ENamp2 are translated into the second control signal AUDctrl1 and the third control signal AUDctrl2, the amplifier-enabling signals ENamp1 and ENamp2 may be in the high level (H) or the low level (L).

As shown in FIG. 6, the power-detection signal PALT is in the second level (that is, the low level). In this situation, the disabling unit 361b of the amplifier enabling circuit 361, the disabling unit 362b of the amplifier enabling circuit 362 and the second-mode-selection unit 352 of the selection circuit 35 are selected. FIG. 6 is a schematic block diagram illustrating the operations of the output stage circuit when the power-detection signal PALT is in the second level. For succinctness, the components that are not selected are indicated by dotted lines.

The second-mode-selection unit 352 of the selection circuit 35 is selected to generate the switching signal Ssw when the power-detection signal PALT operates in the second level. Under this circumstance, the first transistor T1 is turned off, and the voltage of the switching signal Ssw is not influenced by the first transistor T1. Meanwhile, the second transistor T2 is turned off but the third transistor T3 is turned on. Since the second transistor T2 is turned off, the first voltage V1 cannot be transmitted to the sampling node Nsam. Since the third transistor T3 is turned on, the voltage of the sampling node Nsam is transmitted to the switching circuit 33 through the third transistor T3. According to the voltage of the sampling node Nsam (that is, the sampling voltage Vsam), the switching signal Ssw is in the high level so as to turn on the switching circuit 33 and thus couple the switching circuit 33 to the ground Gnd.

The disabling unit 361b of the amplifier enabling circuit 361 and the disabling unit 362b of the amplifier enabling circuit 362 respectively generate the amplifier-enabling signals ENamp1 and ENamp2 when the power-detection signal PALT is in the second level. Under this circumstance, the disabling signal Vdis in the low level (for example, the ground voltage Gnd) is used as the amplifier-enabling signals ENamp1 and ENamp2. The first-stage amplifier 311 and the second-stage amplifier 312 are disabled.

In an embodiment, the first transistor T1 and the second transistor T2 have the same type, but the type of the third transistor T3 is different from the type of the first transistor T1 and the second transistor T2. The conduction of the third transistor T3 is different from the conductions of the first transistor T1 and the second transistor T2.

As mentioned above, according to the characteristic that the level of the power-detection signal PALT can indicate the supply voltage Vdd in real time, different mode selection units can be selected to generate the switching signal Ssw. The first-mode-selection unit 351 is used to generate the switching signal Ssw when the power-detection signal PALT is in the high level. The second-mode-selection unit 352 is used to generate the switching signal Ssw when the power-detection signal PALT is in the low level. After the power-detection signal PALT is changed from the high level to the low level, the second-mode-selection unit 352 exploits the pre-stored high-level sampling voltage Vsam which is pre-stored as the switching signal Ssw. The output node Nout can be quickly coupled to the ground Gnd through the switching circuit 33. Even the supply voltage Vdd is continuously decreased, the switching circuit 33 can maintained in the on-status and the output node Nout may still coupled to the ground Gnd due to the sampling voltage Vsam is high and is used as the switching signal Ssw. Even if residual charges are contained in the amplifier 31, the residual charges can be guided from the output terminal Nout to ground. No pulse is generated at the output terminal Nout, and the speaker does not generate the pop noise.

In an embodiment, the power-detection signal PALT can be an build-in signal of the audio chip which used to detect the status of the supply voltage Vdd. Alternatively, the power-detection signal PALT can be an external signal which used to detect the status of the supply voltage Vdd. In other words, any types of the power-detection signal PALT is not restricted, as long as the power-detection signal PALT can detect the voltage change of the supply voltage Vdd.

Figure 7:
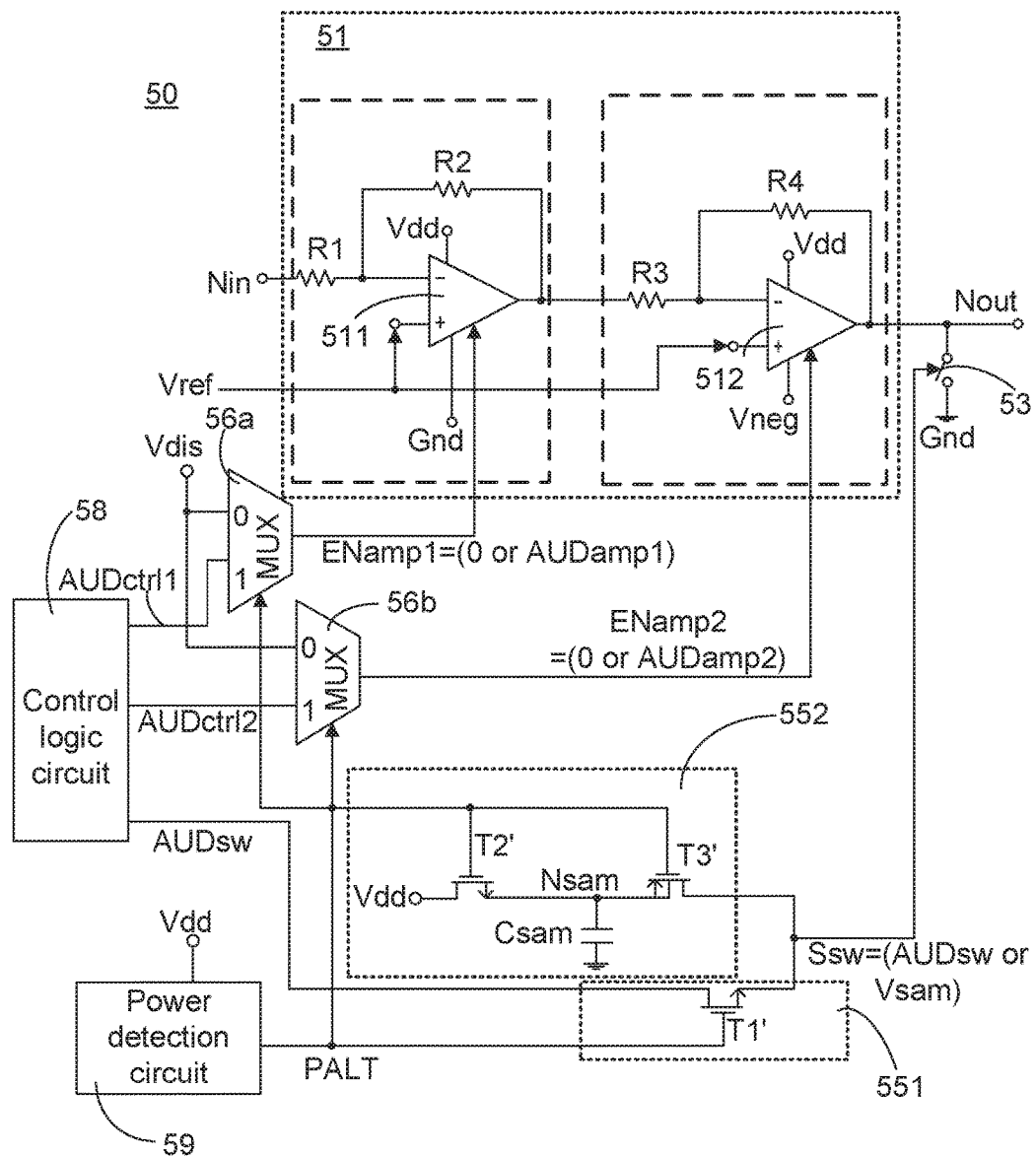
FIG. 7 is a schematic circuit diagram illustrating an example of implementing the concept of the output stage circuit as shown in FIGS. 5 and 6.

FIG. 7 is a schematic circuit diagram illustrating an example of implementing the concept of the output stage circuit as shown in FIGS. 5 and 6. As shown in FIG. 7, the amplifier 51 includes a first-stage amplifier 511 and a second-stage amplifier 512. A positive power terminal of the first-stage amplifier 511 is coupled to a supply voltage Vdd. A negative power terminal of the first-stage amplifier 511 is coupled to ground Gnd. A non-inverted input terminal of the first-stage amplifier 511 is coupled to a reference voltage Vref (for example, 1.1V). An inverted input terminal of the first-stage amplifier 511 is coupled between two resistors R1 and R2. A positive power terminal of the second-stage amplifier 512 is coupled to the supply voltage Vdd. A negative power terminal of the second-stage amplifier 512 is coupled to an inverted supply voltage Vneg. A non-inverted input terminal of the second-stage amplifier 512 is coupled to the reference voltage Vref. An inverted input terminal of the second-stage amplifier 512 is coupled between two resistors R3 and R4. A common-mode voltage of the second-stage amplifier 512 is equal to the ground voltage Gnd. In one embodiment, a first multiplexer 56a generates an amplifier-enabling signal ENamp1 to enable or disable the first-stage amplifier 511, and a second multiplexer 56b generates an amplifier-enabling signal ENamp2 to enable or disable the second-stage amplifier 512. The two data input terminals of the first multiplexer 56a receive the disabling signal Vdis (for example, 0V) and the second control signal AUDctrl1, respectively. The two data input terminals of the second multiplexer 56b receive the disabling signal Vdis and the third control signal AUDctrl2, respectively. The data selection terminals of the first multiplexer 56a and the second multiplexer 56b receive a power-detection signal PALT.

The first multiplexer 56a and the second multiplexer 56b utilize the second control signal AUDctrl1 and the third control signal AUDctrl2 as the amplifier-enabling signals ENamp1 and ENamp2 and send them to the first-stage amplifier 511 and the second-stage amplifier 512 respectively, when the power-detection signal PALT is in the first level. The first-stage amplifier 511 and the second-stage amplifier 512 are operated according to the voltages of the amplifier-enabling signals ENamp1 and ENamp2. The disabling signal Vdis (for example, 0V) is respectively selected as the amplifier-enabling signals ENamp1 and ENamp2 by the first multiplexer 56*a* and the second multiplexer 56*b* when the power-detection signal PALT is in the second level. The first-stage amplifier 511 and the second-stage amplifier 512 are disabled.

In the embodiment, a first mode-selection-unit 551 includes a first transistor T1'. A second-mode selection-unit 552 has a storage capacitor Csam, a second transistor T2' and a third transistor T3'. Wherein, the first transistor T1' and the second transistor T2' are NMOS transistors. The third transistor T3' is a PMOS transistor. The drain terminal of the first transistor T1' is coupled to the control logic circuit 58. The gate terminal of the first transistor T1' receives the power-detection signal PALT. The source terminal of the first transistor T1' is coupled to the switching circuit 53. The drain terminal of the second transistor T2' is coupled to a supply voltage Vdd. The gate terminal of the second transistor T2' receives the power-detection signal PALT. The source terminal of the second transistor T2' is coupled to a sampling node Nsam. The source terminal of the third transistor T3' is coupled to the sampling node Nsam. The gate terminal of the third transistor T3' receives the power-detection signal PALT The drain terminal of the third transistor T3' is coupled to the switching circuit 53. The source terminal and the bulk terminal of the third transistor T3' are coupled to each other.

The first transistor T1' is turned on because the high voltage is applied to the gate terminal of the first transistor T1' when the power-detection signal PALT is in the first level. The first control signal AUDsw is transmitted from the drain terminal of the first transistor T1' to the source terminal of the first transistor T1'. Meanwhile, the source terminal of the first transistor T1' outputs the first control signal AUDsw as the switching signal Ssw. Since the high voltage is applied to the gate terminal of the second transistor T2', the second transistor T2' is also turned on. The supply voltage Vdd is transmitted from the drain terminal of the second transistor T2' to the sampling node Nsam through the source terminal of the second transistor T2'. Under this circumstance, the storage capacitor Csam is charged. Since the high voltage is applied to the gate terminal of the third transistor T3', the third transistor T3' is turned off. In other words, the voltage of the switching signal Ssw is not influenced by the third transistor T3' when the power-detection signal PALT is in the first level.

When the power-detection signal PALT is in the second level, the first transistor T1' and the second transistor T2' are turned off because the low voltage is applied to the gate terminals of the first transistor T1' and the second transistor T2'. The third transistor T3' is turn on since the low voltage is applied to the gate terminal of the third transistor T3', the sampling voltage Vsam is transmitted to the source terminal of the third transistor T3', and the drain terminal of the third transistor T3' outputs the switching signal Ssw.

Figure 8:
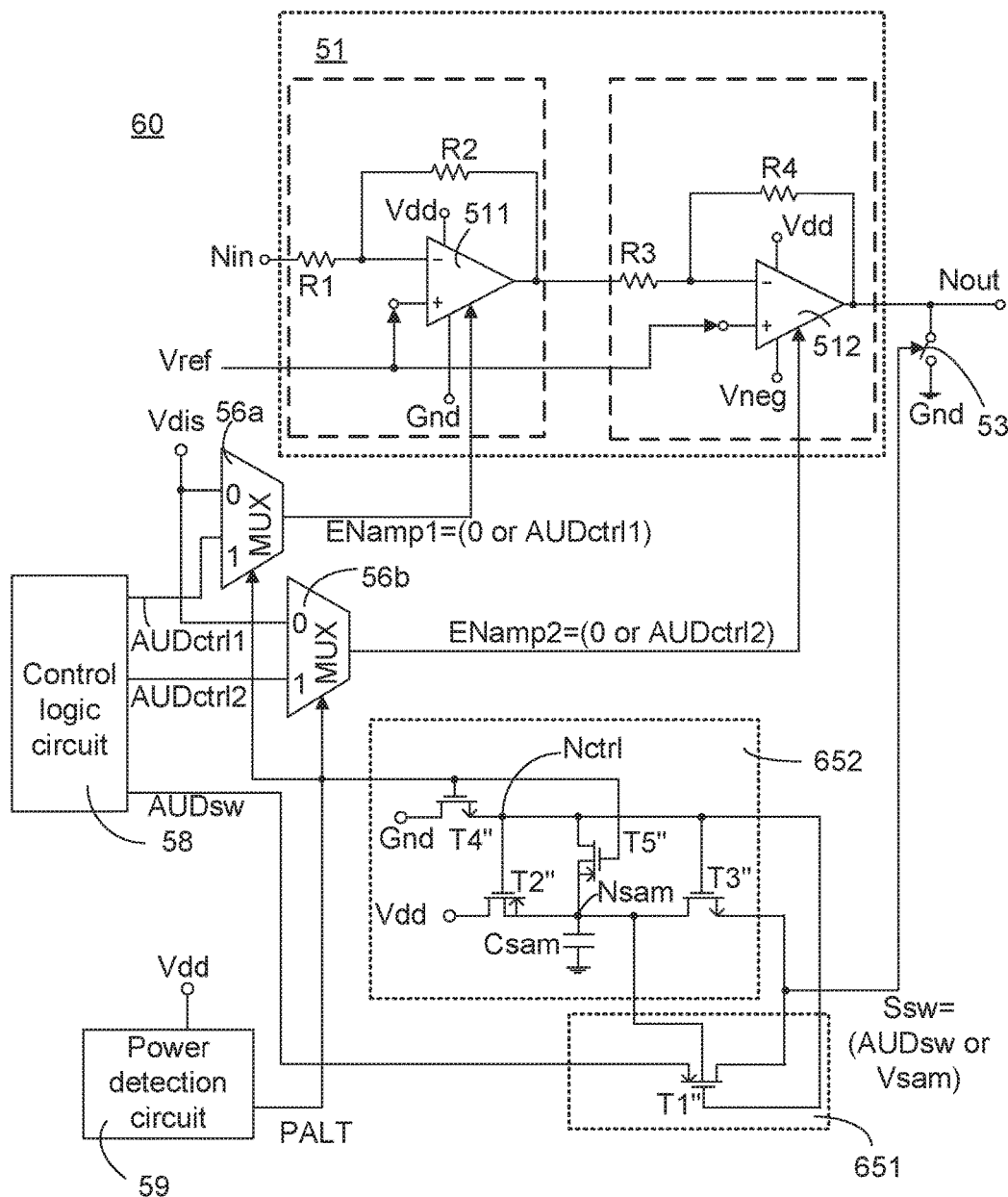
FIG. 8 is a schematic circuit diagram illustrating another example of implementing the concept of the output stage circuit as shown in FIGS. 5 and 6.

FIG. 8 is a schematic circuit diagram illustrating another example of implementing the concept of the output stage circuit as shown in FIGS. 5 and 6. Comparing to FIG. 7, the second-mode-selection unit 652 further includes a fourth transistor T4" and a fifth transistor T5". In addition, the second transistor T2" and a third transistor T3" in this embodiment are controlled by the control node Nctrl instead of the power-detection signal PALT. Wherein, the control node Nctrl is controlled by the power-detection signal PALT through the fourth transistor T4" and the fifth transistor T5". In other words, the second transistor T2" and the third transistor T3" are indirectly controlled by the power-detection signal PALT.

In the embodiment, the first-mode-selection unit 651 includes the first transistor T1", and the second-mode-selection unit 652 includes the second transistor T2", the third transistor T3", the fourth transistor T4", and the fifth transistor T5". Wherein, the first transistor T1", the second transistor T2", and the fifth transistor T5" are PMOS transistors, and the third transistor T3" and the fourth transistor T4" are NMOS transistors. If the storage capacitor Csam leaks current when the PMOS transistors (T1", T2", T5") are turned on, the voltage of the sampling node Nsam is adversely affected. For solving this drawback, the bulk terminals of the PMOS transistors (T1", T2", T5") are coupled to the sampling node Nsam.

The components of the first-mode-selection unit 651 will be described as follows. The drain terminal of the first transistor T1" is coupled to the control logic circuit 58. The gate terminal of the first transistor T1" is coupled to the control node Nctrl. The source terminal of the first transistor T1" is coupled to the switching circuit 53. And, the source terminal of the first transistor T1" generates the switching signal Ssw. The conduction of the first transistor T1" is determined according to the voltage of the control node Nctrl. Wherein, the voltage of the control node Nctrl is determined according to the conduction of the fifth transistor T5".

The components of the second-mode-selection unit 652 will be described as follows. The source terminal of the second transistor T2" is coupled to a sampling node Nsam. The gate terminal of the second transistor T2" is coupled to the control node Nctrl. The drain terminal of the second transistor T2" is coupled to a supply voltage Vdd. The drain terminal of the third transistor T3" is coupled to the sampling node Nsam. The gate terminal of the third transistor T3" is coupled to the control node Nctrl. The source terminal of the third transistor T3" is coupled to the switching circuit 53. The source terminal of the third transistor T3" outputs the switching signal Ssw. The drain terminal of the fourth transistor T4" is coupled to the ground Gnd. The gate terminal of the fourth transistor T4" receives the power-detection signal PALT. The source terminal of the fourth transistor T4" is coupled to the control node Nctrl. The drain terminal of the fifth transistor T5" is coupled to the control node Nctrl. The gate terminal of the fifth transistor T5" receives the power-detection signal PALT. The source terminal of the fifth transistor T5" is coupled to the sampling node Nsam.

The conductions of the first transistor T1", the second transistor T2" and the third transistor T3" are determined according to the voltage of the control node Nctrl. Wherein, the voltage of the control node Nctrl is determined according to the conductions of the fourth transistor T4" and the fifth transistor T5".

The high voltage is applied to the gate terminals of the fourth transistor T4" and the fifth transistor T5" when the power-detection signal PALT is in the first level (e.g. high level). In response to the high voltage, the fourth transistor T4" is turned on and the voltage of the control node Nctrl is equal to the ground voltage Gnd. In response to the high voltage, the fifth transistor T5" is turned off. Since the gate terminal of the first transistor T1" is coupled to the control node Nctrl, the low voltage (that is, the ground voltage Gnd) is applied to the gate terminal of the first transistor T1". In response to the low voltage, the first transistor T1" is turned on. and the first control signal AUDsw is transmitted from the source terminal of the first transistor T1" to the drain terminal of the first transistor T1". Since the gate terminal of the second transistor T2" is coupled to the control node Nctrl, the low voltage (that is, the ground voltage Gnd) is applied to the gate terminal of the second transistor T2". In response to the low voltage, the second transistor T2" is turned on and the voltage of the sampling node Nsam is maintained in the high level (that is, the supply voltage Vdd). Since the gate terminal of the third transistor T3" is coupled to the control node Nctrl, the low voltage (that is, the ground voltage Gnd) is applied to the gate terminal of the third transistor T3". Under this circumstance, the third transistor T3" is turned off.

The low voltage is applied to the gate terminals of the fourth transistor T4" and the fifth transistor T5" when the power-detection signal PALT is in the second level (that is, the low level). In response to the low voltage, the fourth transistor T4" is turned off. In response to the low voltage, the fifth transistor T5" is turned on. Meanwhile, the charges accumulated in the storage capacitor Csam are transmitted to the control node Nctrl through the fifth transistor T5" and the control node Nctrl has the high voltage.

Since the control node Nctrl has the high voltage when the power-detection signal PALT is in the second level, the first transistor T1" and the second transistor T2" are turned off in response to the high gate voltage. Since the second transistor T2" is turned off, the voltage of the sampling node Nsam is not influenced by the second transistor T2". Since the gate terminal of the third transistor T3" is coupled to the control node Nctrl, the third transistor T3" is turned on in response to the high voltage. Meanwhile, the voltage of the sampling node Nsam (that is, the sampling voltage Vsam) is transmitted to the source terminal of the third transistor T3". The high-level sampling voltage Vsam is used as the switching signal Ssw by the second-mode-selection unit 652 when the power-detection signal PALT is in the second level.

In the embodiment of FIG. 8, the conduction of the fourth transistor T4" and the fifth transistor T5" are controlled by the power-detection signal PALT. The fifth transistor T5" is turned off when the fourth transistor T4" is turned on. The fifth transistor T5" is turned on when the fourth transistor T4" is turned off. The voltage of the control node Nctrl is changed according to the conductions of the fourth transistor T4" and the fifth transistor T5". The conductions of the second transistor T2" and the third transistor T3" are determined according to the voltage of the control node Nctrl. The third transistor T3" is turned off when the second transistor T2" is turned on. The third transistor T3" is turned on when the second transistor T2" is turned off.

In the embodiment of FIG. 8, the conductions of the second transistor T2" and the third transistor T3" are not directly determined according to the level of the power-detection signal PALT. The conductions of the second transistor T2" and the third transistor T3" are indirectly controlled by the power-detection signal PALT.

As mentioned in FIGS. 7 and 8, the examples of implementing the selection circuit are not restricted. Take the second-mode-selection unit 352 for example. As long as the level of the power-detection signal PALT is correlated with the conductions of the second transistor T2 and the third transistor T3, the selection circuit is feasible. The storage capacitor Csam is charged when the power-detection signal PALT is in the first level. The storage capacitor Csam provides the sampling voltage Vsam as the switching signal Ssw when the power-detection signal PALT is in the second level.

That is, the selection circuit may be designed according to the practical requirements. The first transistor outputs the first control signal AUDsw as the switching signal Ssw and the storage capacitor Csam is charged to the high voltage when the power-detection signal PALT is in the first level. The storage capacitor Csam provides the high-level switching signal Ssw when the power-detection signal PALT is in the second level. Any other circuit capable of achieving the above purpose can be used as the selection circuit of the present invention.

The examples of the power detection circuit are not restricted. For example, a power-on reset circuit of the audio chip can be used to generate the power-detection signal PALT. The power-detection signal PALT may be generated by an exclusive circuit.

From the above descriptions, the present invention provides an output stage circuit. Since the power-detection signal PALT can indicate the change of the supply voltage Vdd more accurately and quickly, the switching signal Ssw can be quickly adjusted by the selection circuit. That is, the speed of switching from the first-mode-selection unit to the second-mode-selection unit to generate the switching signal Ssw is very fast. In case that the second-mode-selection unit is selected to generate the switching signal Ssw, the storage capacitor Csam provides the sampling voltage Vsam to turn on the switching circuit. The ground Gnd is coupled to the output node Nout when the switching circuit is turned on and the voltage of the output node Nout is equal to the ground voltage Gnd. Due to the pre-stored charges in the storage capacitor Csam, the switching signal Ssw is maintained in the high level (that is, the sampling voltage Vsam). The output node Nout is quickly coupled to ground when the audio chip is switched off or the sudden power interruption event occurs. Since the residual charges of the audio chip are quickly removed from ground, the problem of generating the pop noise is avoided.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An output stage circuit, comprising:
   an amplifier converting an input signal into an output signal, wherein the amplifier has an output terminal;
   a switching circuit coupled between the output terminal of the amplifier and ground; and
   a selection circuit comprising:
      a first-mode-selection unit receiving a first control signal, wherein the first control signal is selected as a switching signal by the first-mode selection-unit when a power-detection signal is in a first level, so that the switching signal selectively turns on the switching circuit; and
      a second-mode-selection unit having a storage capacitor, wherein the switching circuit is turned on according to a voltage stored in the storage capacitor when the power-detection signal is in a second level, so that the output terminal of the amplifier is coupled to the ground,
   wherein the first level is higher than the second level.

2. The output stage circuit as claimed in claim 1, wherein the first-mode-selection unit comprises a first transistor, the first transistor receives the first control signal and is controlled by the power-detection signal, wherein the first transistor is turned on to output the first control signal as the switching signal when the power-detection signal is in the first level, so that the switching signal selectively turns on the switching circuit, wherein the first transistor is turned off when the power-detection signal is in the second level.

3. The output stage circuit as claimed in claim 2, wherein the second-mode-selection unit comprises:
a second transistor; and
a third transistor, wherein conduction of the second transistor and the third transistor are dependent on the level of the power-detection signal,
wherein the second transistor is turned on and the third transistor is turned off when the power-detection signal is in the first level, so that the storage capacitor is charged by a first voltage through the second transistor,
wherein the second transistor is turned off, the third transistor is turned on, and the voltage of the storage capacitor is outputted through the third transistor and used as the switching signal when the power-detection signal is in the second level, so that the switching circuit is turned on.

4. The output stage circuit as claimed in claim 3, wherein the first transistor and the second transistor are N-type transistors, and the third transistor is a P-type transistor, wherein gate terminals of the first transistor, the second transistor and the third transistor receive the power-detection signal, the storage capacitor is coupled between the second transistor and the third transistor, and a source terminal and a bulk terminal of the third transistor are coupled to each other.

5. The output stage circuit as claimed in claim 3, wherein the first transistor and the second transistor are P-type transistors, and the third transistor is an N-type transistor, and gate terminals of the first transistor, the second transistor, and the third transistors are coupled to a control node,
wherein a first terminal of the first transistor receives the first control signal,
wherein a second terminal of the first transistor outputs the first control signal as the switching signal when the power-detection signal is in the first level,
wherein a first terminal of the second transistor receives the first voltage, and a second terminal of the second transistor is coupled to a sampling node,
wherein a first terminal of the third transistor is coupled to the sampling node, and a second terminal of the third transistor outputs the switching signal.

6. The output stage circuit as claimed in claim 5, wherein the second-mode-selection unit further comprises:
a fourth transistor controlled by the power-detection signal, wherein a first terminal of the fourth transistor is coupled to the ground, a second terminal of the fourth transistor is coupled to the control node, and the fourth transistor is turned on when the power-detection signal is in the first level; and
a fifth transistor coupled between the control node and the sampling node, and controlled by the power-detection signal, wherein the fifth transistor is turned on when the power-detection signal is in the second level.

7. The output stage circuit as claimed in claim 6, wherein the fourth transistor is an N-type transistor, and the fifth transistor is a P-type transistor, and wherein a source terminal and a bulk terminal of the second transistor are coupled to each other, and a source terminal and a bulk terminal of the fifth transistor are coupled to each other.

8. The output stage circuit as claimed in claim 1, wherein a supply voltage is provided to the output stage circuit,
wherein the power-detection signal is in the first level when the level of the supply voltage is higher than or equal to a first predetermined threshold voltage,
wherein the power-detection signal is in the second level when the level of the supply voltage is lower than a second predetermined threshold voltage.

9. The output stage circuit as claimed in claim 8, wherein the first predetermined threshold voltage is higher than or equal to the second predetermined threshold voltage.

10. The output stage circuit as claimed in claim 1, wherein the amplifier comprises:
a first-stage amplifier controlled by a second control signal; and
a second-stage amplifier coupled to the first-stage amplifier in series, and controlled by a third control signal, wherein the second-stage amplifier is coupled to the switching circuit, and a common-mode voltage of the second-stage amplifier is equal to a ground voltage,
wherein the second control signal and the third control signal are simultaneously translated into the first control signal when the power-detection signal is in the second level, so that the first-stage amplifier and the second-stage amplifier are disabled.

* * * * *